(12) United States Patent
Spitzer et al.

(10) Patent No.: US 6,469,927 B2
(45) Date of Patent: Oct. 22, 2002

(54) MAGNETORESISTIVE TRIMMING OF GMR CIRCUITS

(75) Inventors: Richard Spitzer, Berkeley, CA (US); E. James Torok, Shoreview, MN (US)

(73) Assignee: Integrated Magnetoelectronics, Berkeley, CA (US)

( * ) Notice: Subject to any disclaimer, the term of this patent is extended or adjusted under 35 U.S.C. 154(b) by 0 days.

(21) Appl. No.: 09/883,645

(22) Filed: Jun. 18, 2001

(65) Prior Publication Data

US 2002/0029462 A1 Mar. 14, 2002

Related U.S. Application Data

(60) Provisional application No. 60/217,337, filed on Jul. 11, 2000.

(51) Int. Cl.$^7$ .......................... G11C 11/15; G11C 11/14

(52) U.S. Cl. ...................... 365/173; 365/158; 365/171; 324/207.21; 324/252

(58) Field of Search .............................. 365/158, 171, 365/172, 173; 324/207.21, 249, 252

(56) References Cited

U.S. PATENT DOCUMENTS

| | | | |
|---|---|---|---|
| 3,972,786 A | 8/1976 | Ballard | 204/32 R |
| 4,751,677 A | 6/1988 | Daughton et al. | 365/158 |
| 4,829,476 A | 5/1989 | Dupuis et al. | 365/158 |
| 5,051,695 A | * 9/1991 | Hunter et al. | 324/249 |
| 5,173,873 A | 12/1992 | Wu et al. | 365/173 |
| 5,477,143 A | * 12/1995 | Wu | 324/207.21 |
| 5,565,236 A | 10/1996 | Gambino et al. | 427/130 |

(List continued on next page.)

FOREIGN PATENT DOCUMENTS

| JP | 4-273486 | * 9/1992 |
|---|---|---|

OTHER PUBLICATIONS

Jaquelin K. Spong, et al., "Giant Magnetoresistive Spin Valve Bridge Sensor", Mar. 1996, *IEEE Transactions on Magnetics*, vol. 32, No. 2, pp. 366–371.

Mark Johnson, "The All–Metal Spin Transistor", May 1994, *IEEE Spectrum*, pp. 47–51.

Mark Johnson, "Bipolar Spin Switch", Apr. 16, 1993, *Science*, vol. 260, pp. 320–323.

J.M. Daughton "Magnetoresistive Memory Technology," Jul. 28—Aug. 2, 1991, *Int'l Workshop on Science and Technology of Thin Films for the 21$^{st}$ Century*, vol. 216, pp. 162–168.

K.T.M. Ranmuthu et al., "New Low Current Memory Modes with Giant Magneto–Resistance Materials," Apr. 13, 1993, *Digests of International Magnetics Conference*, 2 pages.

J.L. Brown, "1–Mb Memory Chip Using Giant Magnetoresistive Memory Cells," Sep. 1994, *IEEE Transactions on Components, Packaging, and Manufacturing Technology*, Part A, vol. 17, No. 3, pp. 373–379.

Paul a. Packan, "Pushing The Limits", Sep. 24, 1999. science Mag, vol. 285, pp. 2079–2081.

Lenssen, et al, "Expectations of MRAM in Comparison With Other Non–Volatile Memory Technologies", Phillips Research Laboratories, pp. 26–30.

*Primary Examiner*—Son Mai
(74) *Attorney, Agent, or Firm*—Beyer Weaver & Thomas, LLP

(57) ABSTRACT

Methods and apparatus are described relating to an electronic device which includes at least one configurable resistive element. Each such configurable resistive element includes at least one multi-layer thin film element exhibiting giant magnetoresistance. The resistance value of each configurable resistive element is configurable over a resistance value range by application of at least one magnetic field which manipulates at least one magnetization vector associated with the thin film element. One embodiment is an adjustable output gate. Another embodiment is a differential amplifier in which the gain of each channel is adjustable.

19 Claims, 6 Drawing Sheets

U.S. PATENT DOCUMENTS

| | | | |
|---|---|---|---|
| 5,585,986 A | 12/1996 | Parkin | 360/113 |
| 5,587,943 A | 12/1996 | Torok et al. | 365/158 |
| 5,640,343 A | 6/1997 | Gallagher et al. | 365/171 |
| 5,640,754 A | 6/1997 | Lazzari et al. | 29/603.14 |
| 5,650,889 A | 7/1997 | Yamamoto et al. | 360/97.01 |
| 5,650,958 A | 7/1997 | Gallagher et al. | 365/173 |
| 5,652,445 A | 7/1997 | Johnson | 257/295 |
| 5,654,566 A | 8/1997 | Johnson | 257/295 |
| 5,661,449 A | 8/1997 | Araki et al. | 338/32 |
| 5,793,697 A | 8/1998 | Scheuerlein | 365/230.07 |
| 5,903,708 A | 5/1999 | Kano et al. | 388/32 |
| 6,278,594 B1 | 8/2001 | Engel et al. | 360/325 |
| 6,292,336 B1 | 9/2001 | Horng et al. | 360/324.12 |

* cited by examiner

US 6,469,927 B2

MAGNETORESISTIVE TRIMMING OF GMR CIRCUITS

RELATED APPLICATION DATA

The present application claims priority from U.S. Provisional Patent Application No. 60/217,337 for MAGNETORESISTIVE TRIMMING FOR AN ULTRAFAST NONVOLATILE RAM filed on Jul. 11, 2000, the entire disclosure of which is incorporated herein by reference for all purposes.

BACKGROUND OF THE INVENTION

The present invention relates to circuits which include multi-layer thin film elements exhibiting giant magnetoresistance (GMR), and more specifically to techniques for resistively trimming such circuits with high degrees of accuracy and precision. Even more specifically, the present invention provides techniques by which (1) the value of a GMR resistor can be adjusted, (2) the output of a transpinnor logic gate can be adjusted, and (3) the gain of each channel of a transpinnor differential amplifier can be adjusted so that its output will be zero even though its two input lines may have different resistances.

Resistive trimming is a technique used to fabricate resistors to a specified accuracy. A standard trimming technique known as laser trimming uses a laser to burn out individual portions of a bank of resistors with binary-sequenced values. This technique is unsatisfactory for many applications in that it is expensive, labor intensive, time consuming, irreversible, and limited in its minimum adjustment to the smallest discrete resistor value in the resistor bank. Moreover, the size of the resistor bank must be such that the spacing between resistors is larger than the spot size of the laser, typically on the order of a micron. This results in an unacceptably large amount of die space for most applications. This is exacerbated by the fact that the typical resistor bank is many time larger than the minimum feature size of many of the devices in which trimmed resistors have potential applications.

One potential application for resistive trimming is in balancing the many sense/reference line pairs in a memory device such as, for example, a memory device based on GMR structures, an example of which is described in U.S. Pat. No. 5,587,943 for NONVOLATILE MAGNETORESISTIVE MEMORY WITH FULLY CLOSED FLUX OPERATION issued on Dec. 24, 1996, the entire disclosure of which is incorporated herein by reference for all purposes. That is, random variations that may occur during fabrication of such devices result in line pairs that are not matched closely enough. Such resistance mismatches depend on a number of different factors including, for example, feature size, process stability, and point-to-point variations in film properties such as thickness, crystallite structure, stoichiometry, and layering effect variations.

Unfortunately, laser trimming would be unsuitable for such memory devices in that line widths and line spacing of less than 0.5 microns (even down to 100 nm) are anticipated. The size of the resistive banks necessary for laser trimming would not only be prohibitively expensive, but would account for most of the die area, subverting any gains in miniaturization.

In view of the foregoing, it is desirable to develop resistive trimming techniques for nanoscale devices in which the resistive trimming overhead comprises only a small portion of the overall device size. It is further desirable that such techniques allow greater trimming precision, can be automated under computer control, and are reversible so that resistance values can be adjusted to compensate for changing conditions.

SUMMARY OF THE INVENTION

According to the present invention, resistive trimming techniques are provided which address all of the shortcoming described above. That is, the present invention provides a technique referred to herein as magnetoresistive trimming which manipulates resistance values through the application of magnetic fields to giant magnetoresistive (GMR) structures.

Thus, the present invention provides an electronic device including at least one configurable resistive element having a resistance value associated therewith. Each such configurable resistive element includes at least one multi-layer thin film element exhibiting giant magnetoresistance. The resistance value of each configurable resistive element is configurable over a resistance value range by application of at least one magnetic field which manipulates at least one magnetization vector associated with the thin film element. According to various embodiments, the configurable resistive elements comprise a single multi-layer thin film element. According to other embodiments, the configurable resistive elements comprise active GMR devices described herein as "transpinnors" which exhibit characteristics of both transistors and transformers.

According to another specific embodiment, a method for matching first and second resistance values in a memory is provided. The first and second resistance values are associated with first and second memory access lines, respectively. A configurable resistive element comprising at least one multi-layer thin film element exhibiting giant magnetoresistance is associated with at least one of the first and second memory access lines. The magnetization of the thin film element is manipulated such that the first and second resistance values match within a specified tolerance.

According to yet another embodiment of the invention, a method for accessing a memory having first and second pluralities of access lines is provided. The second plurality of access lines comprises pairs of access lines, each of which have a resistive element associated therewith comprising at least one multi-layer thin film element exhibiting giant magnet resistance. The magnetization of the thin film element is configured such that each pair of access lines carries equal currents when the memory bits on the two lines are in identical magnetic states. According to this embodiment, individual memory cells in the memory are accessed using coincident currents in corresponding ones of the first and second pluralities of access lines.

A further understanding of the nature and advantages of the present invention may be realized by reference to the remaining portions of the specification and the drawings.

DETAILED DESCRIPTION OF SPECIFIC EMBODIMENTS

The present invention provides techniques (referred to herein collectively as magnetoresistive trimming) which rely on the application of magnetic fields to giant magnetoresistive (GMR) films rather than the bulky resistor banks and lasers of laser trimming techniques. Three different types of magnetoresistive trimming will be described.

According to a first type of embodiment, one or more GMR film elements are placed in a circuit in the locations where resistor banks would have otherwise gone. One or more magnetic fields are then applied to the GMR element(s) to modify the magnetization orientation of their successive magnetic layers, therefore achieving a desired resistance value for each. This technique works well for applications in which resistance variations are relatively small.

According to another embodiment, a multi-functional GMR device (referred to herein as a transpinnor) having characteristics of both a transistor and a transformer and operating as a logic gate is used to balance the currents in, for example, sense/reference line pairs in a memory device. This technique works well even where the resistance differences are relatively large.

According to a third embodiment, magnetoresistive trimming is used to adjust the gain of one or more channels of a transpinnor differential sense amplifier so that it yields zero output even if its two input lines have unequal currents.

Figure 1:
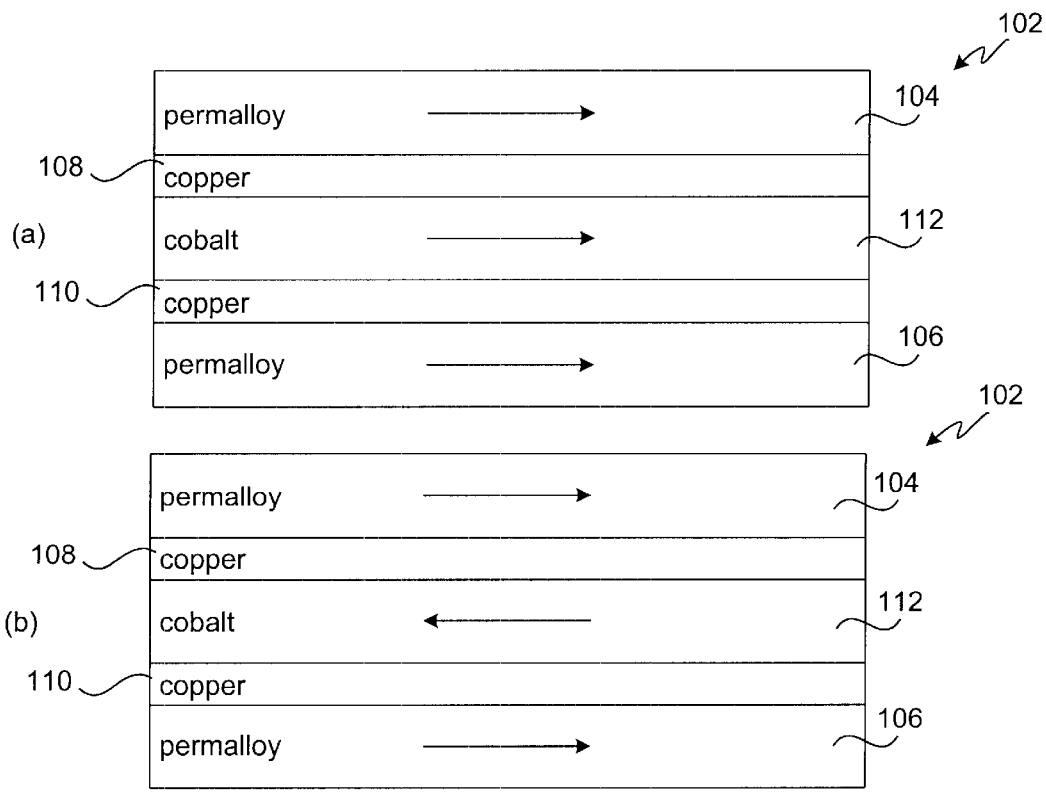
FIG. 1 is a simplified diagram of a multi-layer thin film element exhibiting giant magnetoresistance (GMR)

A GMR film includes alternating magnetic and nonmagnetic conductor layers. An example of such a structure is shown in FIG. 1. GMR film 102 has two 4 nm permalloy layers (104 and 106), two 2 nm copper layers (108 and 110), and a 4 nm cobalt layer 112. Such GMR structures may have multiple periods repeating this basic structure. When the magnetic layers of a GMR film are magnetized in the same direction (FIG. 1a), the resistance of the film is minimized. This is due in part to the fact that the conduction electrons in magnetic materials are spin polarized in the same direction as the electrons causing the magnetization.

If, on the other hand, adjacent magnetic layers are magnetized in opposite directions (FIG. 1b), conduction electrons moving between the adjacent layers encounter high interface scattering and there is a corresponding increase in the overall resistance of the film. The GMR value of such a film is typically defined as the percentage difference between the maximum resistance $R_{max}$ and the minimum resistance $R_{min}$ divided by the minimum resistance. The fractional difference is defined herein by $$gmr = (R_{max} - R_{min})/R_{min} \quad (1)$$

The actual resistance of the GMR film depends on the applied magnetic field H and has a component proportional to the fraction f(H) of the film for which the magnetizations of the alternating layers are antiparallel less that for which they are parallel, $$R(H) = R_{average} + R_{min}\delta \quad (2a)$$

$$\delta = f(H) \, gmr/2 \quad (2b)$$

Figure 2:
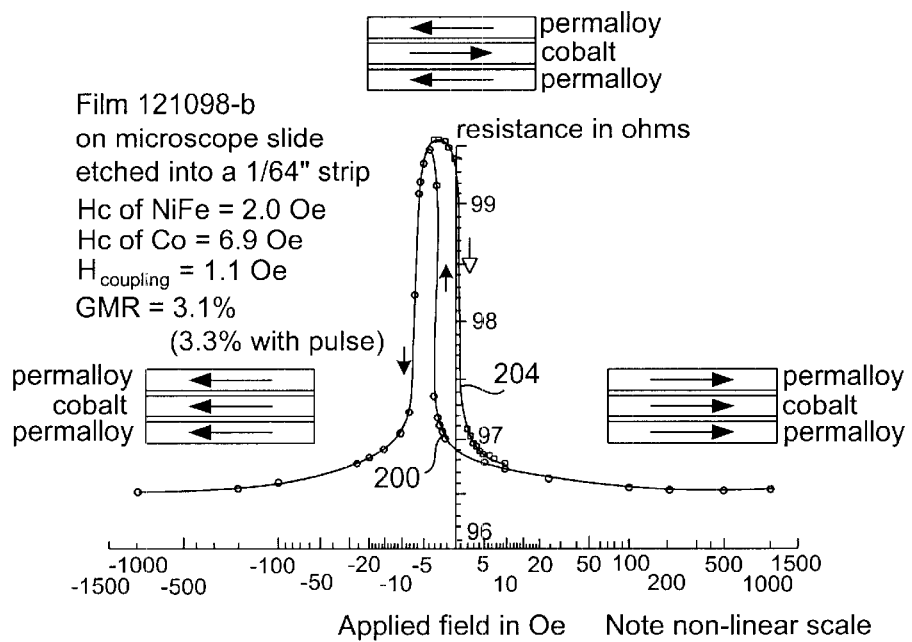
FIG. 2 is a graph illustrating the relationship between the resistance of a GMR film and an applied magnetic field.

An example of the relationship between the resistance R of a GMR film and the applied magnetic field is shown in the R-H curve of FIG. 2. R-H curve 202 shows half a major loop starting at high positive field and progressing to high negative field. The resistance rises when the magnetization of the permalloy layers reverse and become antiparallel to the magnetization of the cobalt layer (which doesn't switch because of its higher coercivity). When the coercivity of the cobalt layer is eventually overcome and the magnetization of the cobalt layer switches, the magnetization of the adjacent layers are again parallel and the resistance falls. R-H curve 204 is half a minor loop starting with the magnetization of the permalloy layers antiparallel to that of the cobalt layer and becoming parallel again as the applied field becomes more positive.

It can be seen from the R-H curves of FIG. 2 that the magnetoresistive trimming technique of the present invention may be used to adjust the resistance of a multi-layer GMR thin film element up or down in a continuous manner. Adjustment may even be done while the GMR film is operating in its intended application. In addition, and according to various embodiments, the applied field may come from a stripline adjacent to or integral with the GMR film, from an external coil, or both.

Specific embodiments of the magnetoresistive trimming techniques of the present invention will now be described in the context of a nonvolatile, random-access memory in which multi-layer GMR films are used for storage, reading, and writing. Writing is an inductive operation in which the magnetization vector in a storage element is switched by a coincidence of currents in word and digit lines which provide random access to the storage elements in the memory array. Reading is accomplished through the sensing of resistance changes in the GMR storage elements.

According to a specific embodiment, this triple function—storage, read, and write—is achieved using a multi-layer structure in which successive magnetic layers have differing coercivities. In some embodiments, cobalt is used for high coercivity layers while permalloy is used for low coercivity layers. In such embodiments, the cobalt layer contains the stored information and the permalloy layer is used for readout. For a more complete discussion of the operation of such a memory, please refer to U.S. Pat. No. 5,587,943 incorporated herein by reference above.

Figure 3:
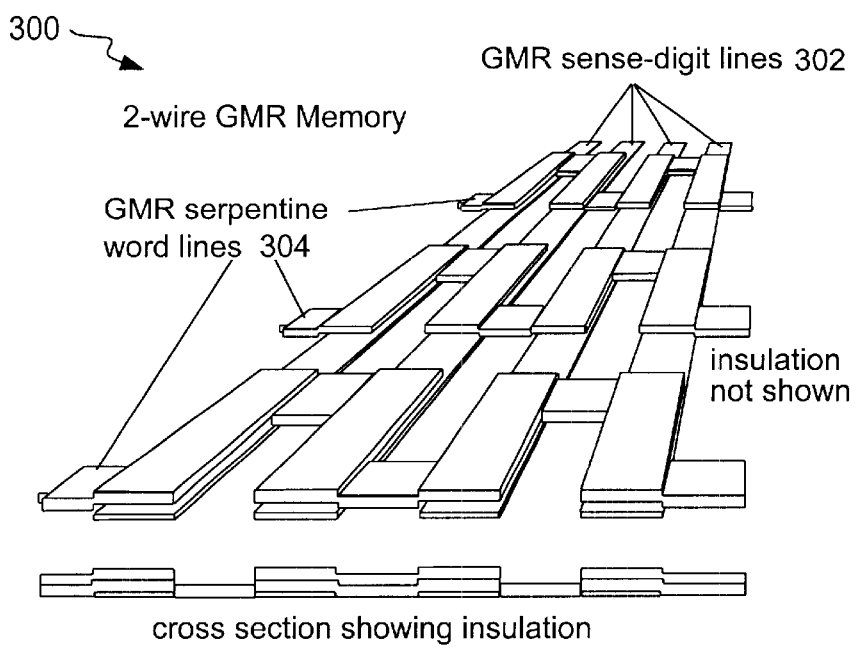
FIG. 3 shows perspective and cross-sectional views of a memory array for use with specific embodiments of the present invention.

A portion of an exemplary memory array 300 for use with specific embodiments of the present invention is shown in FIG. 3. The memory cells are accessed via combination sense-digit lines 302 and serpentine word lines 304. Sense-digit lines 302 are multi-layer GMR films. The active bit area, i.e., the locations where information may be stored, is where a segment of a word line 304 runs parallel with and directly over a sense-digit line 302, i.e., an overlap region. Storage is in the higher coercivity layer of that portion of the sense-digit line. The lower coercivity layer of the sense-digit line is used for reading. That is, sense-digit lines 302 supply current for magnetoresistive sensing of the magnetization of the storage layer. Sense-digit lines 302 also provide the half-select field for switching of the higher coercivity storage layer during a write operation and for switching of the lower coercivity layer during a read operation. The sense signal stands on a pedestal that changes depending on the state of the other bits along the sense line. This pedestal must be removed in the read operation.

In applications of memory array 300 to a high-speed random access memory, each storage location representing a single bit uses two neighboring overlap regions, i.e., the portions of two adjacent sense-digit lines 302 overlapped by a single word line 304. The two neighboring sense-digit lines will also be referred to herein as the sense-digit and reference lines. The pedestal and noise are removed by a first-stage circuit (not shown) which rejects common signals between the sense-digit line and the reference line, thus giving the bit value directly.

Figure 4:
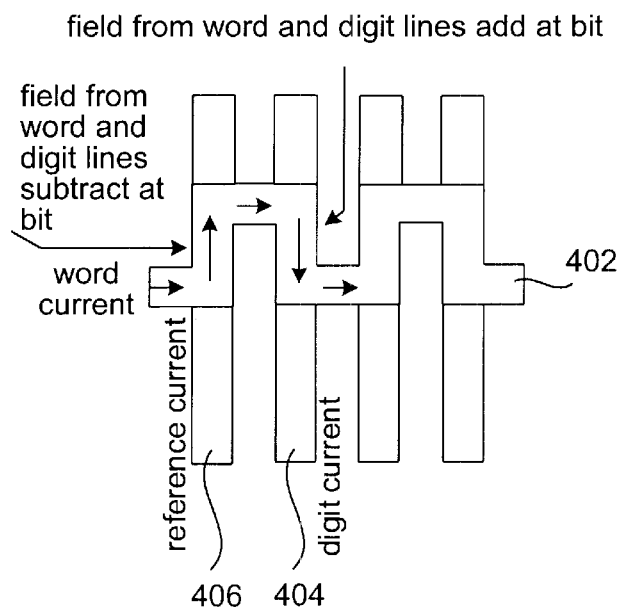
FIG. 4 illustrates the effect of current in a word line of a memory array.

Operation of memory array 300 will now be described with reference to FIG. 4 in which two pairs of reference and sense-digit lines are shown intersecting with a word line 402. Prior to a read operation, the two lines of each reference/sense-digit pair are in identical magnetic states, i.e., the magnetizations of the corresponding layers of both lines are the same. Current pulses in the sense-digit/reference pair (e.g., lines 404 and 406) leave the storage layers (i.e., the higher coercivity layers) of each memory cell on those lines unchanged, while impressing the same magnetization on the sense layers (i.e., the lower coercivity layers) of each memory cell on the line pair except for the sense layers in the two neighboring memory cells being interrogated. That is, a coincident current in word line 402 keeps the lower coercivity layers of these two adjacent memory cells in opposite states. This can be understood with reference to the opposing directions of the word line current in adjacent cells as shown in FIG. 4.

The result is that the magnetizations of the adjacent sense-digit and reference lines are identical except in the readout layers of the bit being read. Currents are then sent down the sense-digit line 404 and the corresponding reference line 406 to measure their respective resistances. By comparing the two resistance values, the bit value of the memory cell of interest can be determined. The line with the lower resistance has all magnetic layers magnetized in the same direction, whereas the resistance will be higher in that line of the pair in which the magnetization of the readout layer is opposite to that of the storage layer. When the same voltage is applied to the two lines, the two channels of the transpinnor differential amplifier will receive currents whose difference reflects the different magnetizations in the sense-digit and reference lines, causing a nonzero output.

For this technique to work properly, any offset arising from a a prior difference in resistance between each sense-digit line and its corresponding reference line must be smaller than the signal to be read. According to various specific embodiments, minimization of these resistance differences is achieved using the magnetoresistive trimming technique of the present invention.

According to one embodiment, one or more GMR film elements are placed in series with one or both of the lines in a pair. The magnetizations (and thus the resistances) of selected ones of these GMR film elements are then manipulated such that the resistances of the two lines match very closely. According to a more specific embodiment, matching has been achieved which exceeds the precision of the measurement equipment. According to another embodiment which will now be described, a transpinnor is used to balance the line pairs.

A transpinnor is a multifunctional, active GMR device with characteristics similar to both transistors and transformers. Like a transistor, it can be used for amplification, logic, or switching. Like a transformer, the transpinnor can be used to step voltages and currents up or down, with the input resistively isolated from the output. Like a transistor, a transpinnor can be integrated in a small space. Unlike conventional transformers, a transpinnor has no low frequency cutoff, the coupling being flat down to and including DC. In addition, the operational characteristics of the transpinnor (including amplification, current requirements, and speed) tend to improve as its dimensions get smaller. For more information on transpinnors, please refer to U.S. Pat. Nos. 5,929,636 and 6,031,273 for ALL-METAL, GIANT MAGNETORESISTIVE, SOLID-STATE COMPONENT issued Jul. 27, 1999, and Fe. 29, 2000, respectively, the entire disclosures of which are incorporated herein by reference for all purposes.

Figure 5:
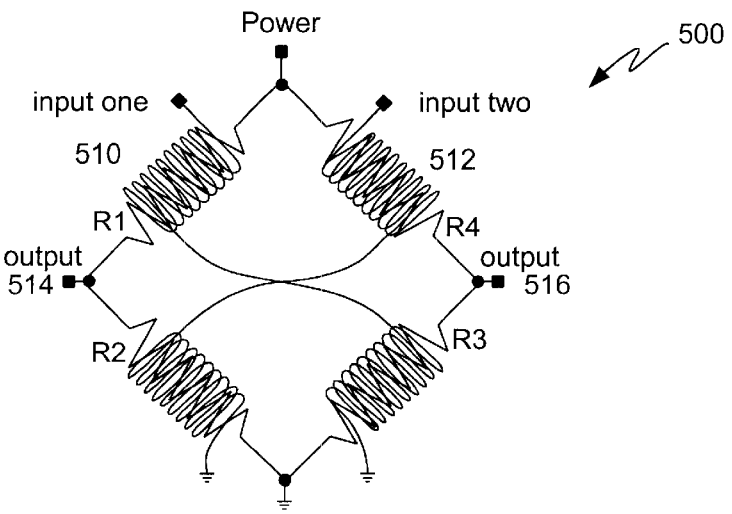
FIG. 5 is a simplified circuit diagram of a transpinnor for use with specific embodiments of the present invention.

A specific implementation of a transpinnor 500 is shown in FIG. 5. Four resistive elements R1–R4 comprising GMR film structures are configured as a Wheatstone bridge. Current in either of input lines 510 or 512 creates a magnetic field at one or more of GMR films R1–R4. This unbalances the bridge and creates an output signal between output terminals 514 and 516. In the transpinnor implementation of FIG. 5 input lines 510 and 512 are shown inductively coupled to resistive elements R1–R4 with coils. According to other integrated circuit embodiments, this coupling is achieved using striplines.

As mentioned above, the resistance of each leg of transpinnor 500 may be changed by application of a magnetic field to manipulate the magnetization vectors of the respective GMR film's layers. Such fields are generated by the application of currents in input lines 510 and 512 which are electrically insulated from the GMR films. Input line 510 is inductively coupled to and provides magnetic fields for altering the resistance of GMR films R1 and R3. Input line 512 is inductively coupled to and provides magnetic fields for altering the resistance of GMR films R2 and R4. If the resistances of all four GMR films are identical, equal currents in input lines 510 and 512 change the resistances equally and do not unbalance the bridge, thus resulting in zero output. If, however, unequal currents are applied, a resistive imbalance results, thus resulting in a nonzero output.

Figure 6:
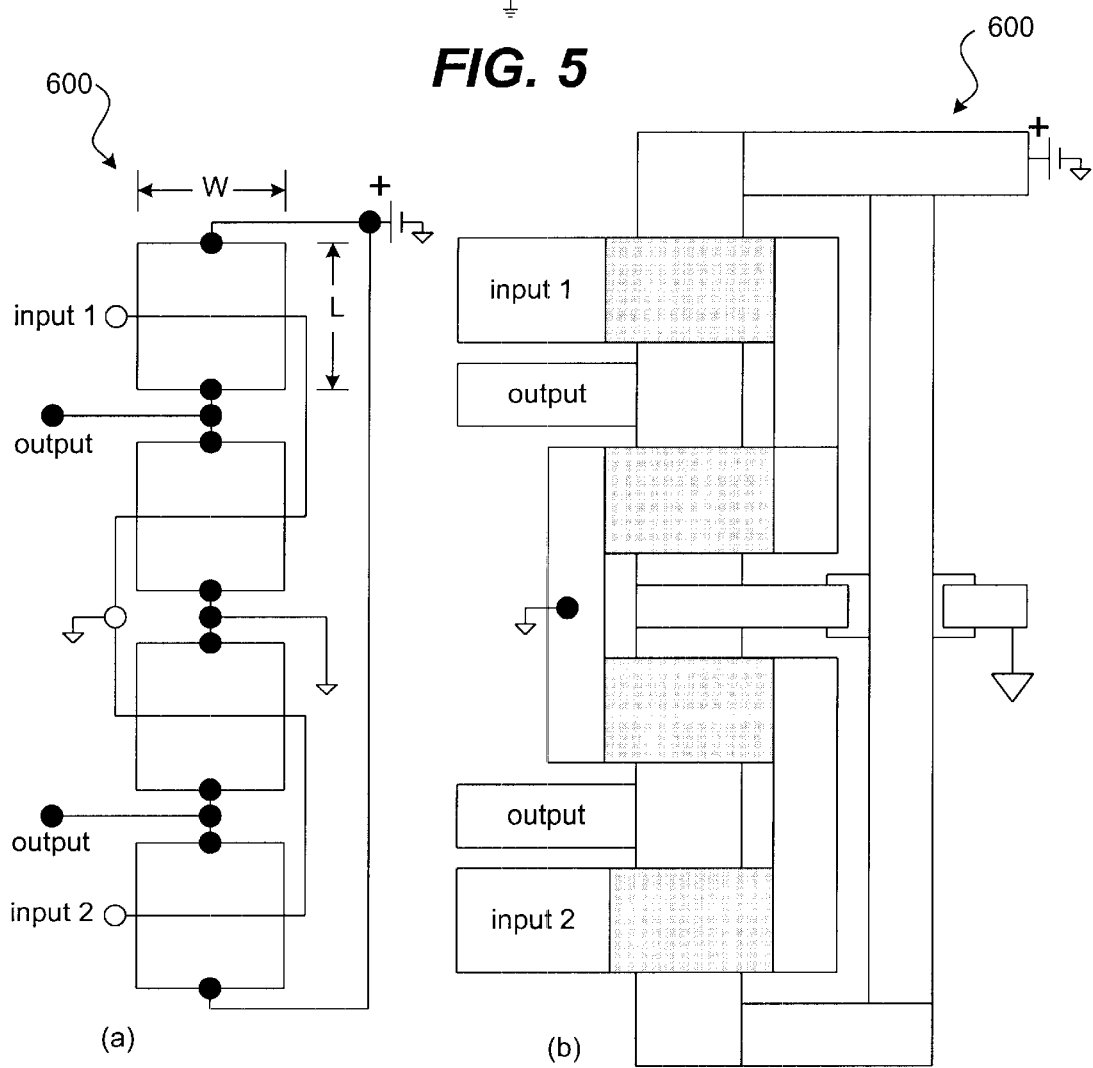
FIGS. 6a and 6b are simplified representations of a differential transpinnor for use with specific embodiments of the present invention.

FIG. 6 shows a circuit diagram (a) and an integrated circuit layout (b) of an integrated circuit implementation of a differential transpinnor 600 for use with specific embodiments of the present invention. According to a specific embodiments, transpinnor 600 requires very few fabrication steps having only a single GMR film, an insulation layer, a single conductor layer, a second insulation layer, and a thick pad metal layer.

The relationship between the output voltage of transpinnor 500 and a variety of other parameters including power supply voltage, input current, GMR value, leg resistance values, and output resistance will now be described. This analysis assumes the ideal case where the resistance of each of four resistive elements $R_1$–$R_4$ (when in identical magnetic states) is identical, and denotes this resistance value as r. When a positive current is applied at input 1 and a negative current is applied at input 2, the various resistances are given by:

$$R_1 = r(1-\delta) \tag{3a}$$

$$R_2 = r(1+\delta) \tag{3b}$$

$$R_3 = r(1-\delta) \tag{3c}$$

$$R_4 = r(1+\delta) \tag{3d}$$

where $\delta$ is given by equation 2b.

The output resistance of transpinnor 500 is denoted $r_5$. The current in each of resistive elements $R_1$–$R_4$ and $r_5$ is denoted $i_1$–$i_5$, respectively. The voltage drop across the entire bridge, i.e., the voltage applied to the power lead) is denoted V. From Kirchoff's laws we then have $$i_1 - i_2 - i_5 = 0 \quad (4a)$$

$$i_4 - i_3 + i_5 = 0 \quad (4b)$$

and from symmetry, $$i_1 = i_3 \quad (5a)$$

$$i_2 = i_4 \quad (5b)$$

Because the voltage drop over any path between the power lead and ground must be V, $$(1-\delta)ri_1 + (1+\delta)ri_2 = V \quad (6)$$

$$(1-\delta)ri_1 + i_5 r_5 + (1-\delta)ri_1 = V \quad (7)$$

Combining equations (4), (6), and (7), $$i_5 = 2 i_1 \delta / [1 + \delta(r_5/r)] \quad (8a)$$

This equation represents the output current of transpinnor 500.

Also of interest is the dependence of the amplification factor, $$A = \text{output current/input current} \quad (9)$$

on the power supply to transpinnor 500 and the line width of the GMR films. For this analysis will use the approximation that $r_5/r << 1$. This is due to the fact that the input and output lines of transpinnor 500 are much thicker than the GMR films (e.g., 20 nm of copper and 300 nm of AlCu vs. 2–4 nm of copper). In addition, because the fractional change in resistance satisfies $\delta \leq 0.5$ gmr (see equation 2b), $\delta << 1$ also. In the case of complete switching, i.e., f(H)=1, equation 8a then becomes $$i_5 = 2 i_1 \delta = i_1 \, gmr \quad (8b)$$

The input current must be sufficient to switch the lower coercivity, e.g., permalloy layer of the GMR films, i.e., sufficient to produce a magnetic field equal to the layer coercivity, $H_c$. The field H produced by a current i in a stripline of width w and length L is found from Maxwell's equation, curl H=J', to be $$H = 2\pi i / w \text{ Oe} \quad (10)$$

where i is in mA and w is in microns. (In changing units from Maxwell's equation to those in equation (10) it should be noted that $4\pi \text{Oe} = 10^3$ amps/meter.) Thus, the input current required to produce a field $H_c$ is $$\text{input current} = (1/2\pi) H_c \, w \text{ mA/(Oe-micron)} \quad (11)$$

To derive the output current, it should be noted with reference to FIG. 5 that the power voltage V is applied to $R_1$ and $R_2$ in series, and that because $i_5$ is small, the current in resistive elements $R_1$ and $R_2$ can be approximated as $i_1$. Thus, the current $i_1$, according to Ohm's law, is the ratio of V (in volts) to the sum of $R_1$ and $R_2$, or 2r (in ohms). So, $i_1 = 10^3 \, V/(2r)$ mA, and therefore according to equation (8b) the output current is $$\text{output current} = 10^3 \, gmr \, V/(2r) \text{ mA} \quad (12)$$

The amplification factor is then $$A = \pi 100 \, gmr \, V/(r \, H_c \, w) \quad (13a)$$

It is further useful to express the resistance r of the four GMR resistors in FIG. 6 in terms of the product of the sheet resistivity, $R_{sq}$, in ohms per square, and the number of squares, L/w, i.e., $r = (L/w) R_{sq}$. Then the amplification, A, may be written $$A = \pi 1000 \, gmr \, V/(H_c \, R_{sq} \, L) \quad (13b)$$

where $H_c$ is in Oe, and w and L are in microns.

Figure 7:
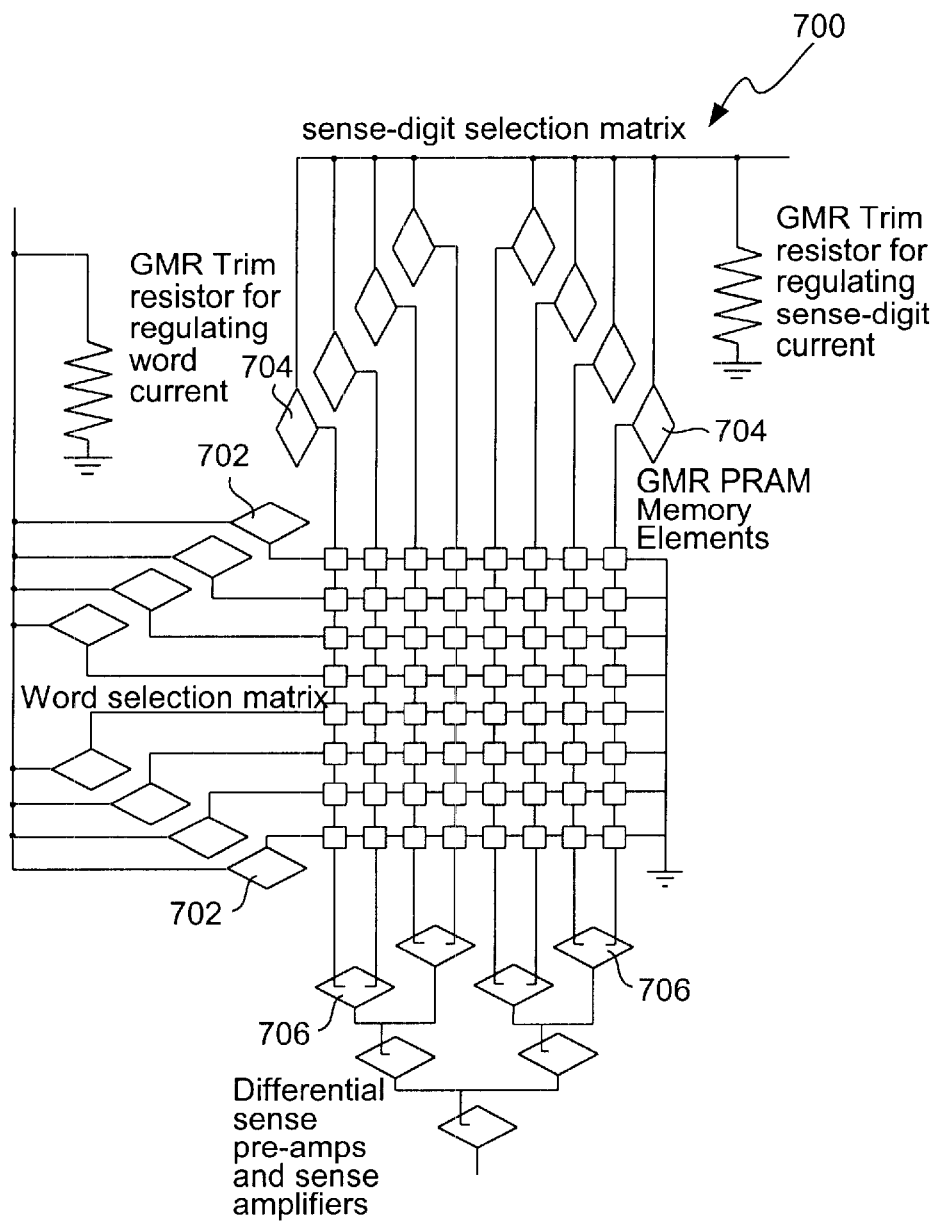
FIG. 7 is a simplified schematic diagram of a memory array designed according to a specific embodiment of the present invention.

Transpinnors may form the basis for general purpose all-metal electronics; digital as well as analog. For example, these GMR devices can be used for all electronic functions in a random access memory array such as memory array 700 of FIG. 7. That is, transpinnors may be used to select the word lines to be activated (702), select the sense-digit and reference lines to activated (704), regulate the voltage to the drive lines, amplify the difference in current between selected sense-digit and reference line pairs (706), and perform further sense amplification in successive stages.

It turns out that the transpinnor is extremely effective for applications in which a physical signal is to be read above an offset arising from the difference between two unevenly match input lines. It functions as a transformer at its input, rejecting the common-mode signal between the two lines, and as a differential amplifier at its output, amplifying the physical signal. In memory array 700 there is a differential transpinnor 706 coupled to each sense-digit/reference line pair such that the sense-digit line is connected to input 1 of the transpinnor and the corresponding reference line is connected to input 2 (see FIGS. 5 and 6). As discussed above, inputs 1 and 2 of each transpinnor are only inductively coupled to its GMR film resistive elements, the input being DC isolated from the output.

When the sense-digit and reference lines of a pair are in the same magnetic state, the output of the differential transpinnor 706 should be zero. However, because of imperfections arising in the fabrication process, the resistance of a sense-digit line will typically be different than that of its reference line. Consequently, when the same voltage is applied to the two lines, different currents enter the two inputs of the associated differential transpinnor 706 causing a nonzero output in an untrimmed transpinnor, and thus the potential for error. According to a specific embodiment of the present invention, the differential transpinnor 706 for each sense-digit/reference line pair may be trimmed to compensate for this imbalance.

That is, compensation for the resistive imbalance is achieved by reducing the output of the transpinnor through at least partial reversal of one of the high coercivity, i.e., cobalt, layer. According to a specific embodiment, the other side of the transpinnor is operated with the high coercivity layer(s) saturated. The low coercivity layer(s) remains free to react to the input current, thereby producing the dynamic output. By reversing just the right percentage of the cobalt layer, the output of the transpinnor can be made to go to zero when the reference and sense-digit lines are in the same magnetic state, i.e., when it is supposed to be zero.

Equation (8b) represents the case where the currents of inputs 1 and 2 are equal in magnitude and of opposite polarity. When the currents are of the same polarity and different magnitude, the equation becomes $$i_5 = i_1 (\delta_1 - \delta_2) \quad (14)$$

Since the two fractional resistance changes are unequal, $i_5$ is nonzero. In equation (2b), f(H) is the fraction of the film for which the magnetization of the high coercivity layer and the low coercivity layer (i.e., the cobalt layer and the permalloy layer) are antiparallel less that for which they are parallel. We can therefore write f(H) as the product of two terms, one representing the high coercivity layer and one representing the low coercivity layer, $$f(H)=f_c(H) f_p(H) \quad (15)$$

where $f_c(H)$ is the fraction of the cobalt layer magnetized in the positive direction less that magnetized in the negative direction and $f_p(H)$ is the corresponding fraction for the permalloy layer. This assumes that the layers switch independently of one another which is a reasonable assumption in that the coercivity of cobalt is much higher than that of the permalloy, and the transpinnor is typically operated at low field where only the magnetization of the permalloy changes and that of the cobalt remains fixed. That is, $$f_c(H) = \text{constant} \quad (16)$$

but the values of $f_c(H)$ will in general be different for the two inputs.

The transpinnor can be set up so that the response of the permalloy to the applied field (from the current in the input line) is relatively linear for the current range of interest, i.e., $$f_p = k I \ |f_p| < 1 \quad (17)$$

where the value of the proportionality constant k is determined by the shear of the loop. Denote the current from the reference line by $i_{ref}$ and the current from the sense-digit line by $i_{sense}$. Then $$\delta_1 = f_{c1} f_p \, gmr/2 = f_{c1} \, k \, i_{sense} \, gmr/2 \quad (18)$$

$$\delta_2 = f_{c2} f_p \, gmr/2 = f_{c2} \, k \, i_{ref} \, gmr/2 \quad (19)$$

Then, by equations (14), (19), and (20), the output current 15 of the transpinnor is given by $$i_S = i_1 (\delta_1 - \delta_2) = i_1 \, k \, (gmr/2)(f_{c1} \, i_{sense} f_{c2} \, i_{ref}) \quad (20)$$

Equation (20) reveals that even if the sense current is different than the reference current when the line are in the same magnetic state, the output current $i_s$ can be made zero by adjusting the magnetization in the cobalt film. Thus, for example, if the current in a sense-digit line is greater than that in the corresponding reference line, the currents can be balanced by saturating the cobalt in the reference leg of the transpinnor in the positive direction so that $f_{c2}=1$ and partially reversing the cobalt in the sense-digit leg of the transpinnor such that $f_{c1}=i_{ref}/i_{sense}$. This balances the input, even though the lines have different resistances. The adjustment is facilitated by the fact that the two cobalt layers can be adjusted independently. It should be noted that this technique can compensate for virtually any resistive inequality in a given sense-digit/reference line pair. This is even the case where the difference in resistance is much greater than the films' gmr values.

According to various specific embodiments of the present, there are a number of ways in which a transpinnor may be connected to a sense-digit/reference line pair. Four of these options will now be described with reference to FIG. 8. Each option is shown using coils. However, it will be understood that the present invention contemplates analogous embodiments using striplines. In addition, for the purpose of clarity, each of the embodiments is shown with only the transpinnor's input lines, i.e., omitting the resistive elements.

FIG. 8(a) shows the input lines 802 and 804 of a transpinnor configured such that each of the transpinnor's four resistive elements (not shown) is influenced by current from both sense-digit line 806 and reference line 808. In the figure this is shown as the coils being configured concentrically. In a stripline embodiment, the input lines would be striplines deposited on top of the other layers with insulation in between. This configuration has the highest sensitivity for differential amplification of the four shown, but has relatively low sensitivity for trimming unless the overlap of the input lines is only partial.

FIG. 8(b) shows input lines 812 and 814 of a transpinnor configured such that the current from sense-digit line 816 goes through only input line 812 which supplies magnetic fields to two of the transpinnor's resistive elements, while current from reference line 818 goes through only input line 814 which supplies magnetic fields to the other two resistive elements of the transpinnor. The high-coercivity layer of any pair of GMR resistive element can be partially demagnetized so that each channel of the transpinnor has a differet amplification factor. This can be adjusted to make the output zero when the sensedigit and reference lines are in identical magnetic states. Transpinnor 500 of FIG. 5, for example, is configured for such a connection.

FIG. 8(c) shows input lines 822 and 824 of a transpinnor connected in series between the midpoints of sense-digit line 826 and reference line 828. In this configuration, the current flowing through the two input lines is proportional to the difference in resistance between them. The high-coercivity layers of the pairs of GMR resistors can be adjusted as in FIG. 8(b).

FIG. 8(d) shows input line 832 coupled between sense-digit line 836 and reference line 838. Input line 834 is used to compensate for any intrinsic difference in resistance between them, i.e., to eliminate any offset. This configuration is the least sensitive of the four shown for differential amplification.

Figure 8:
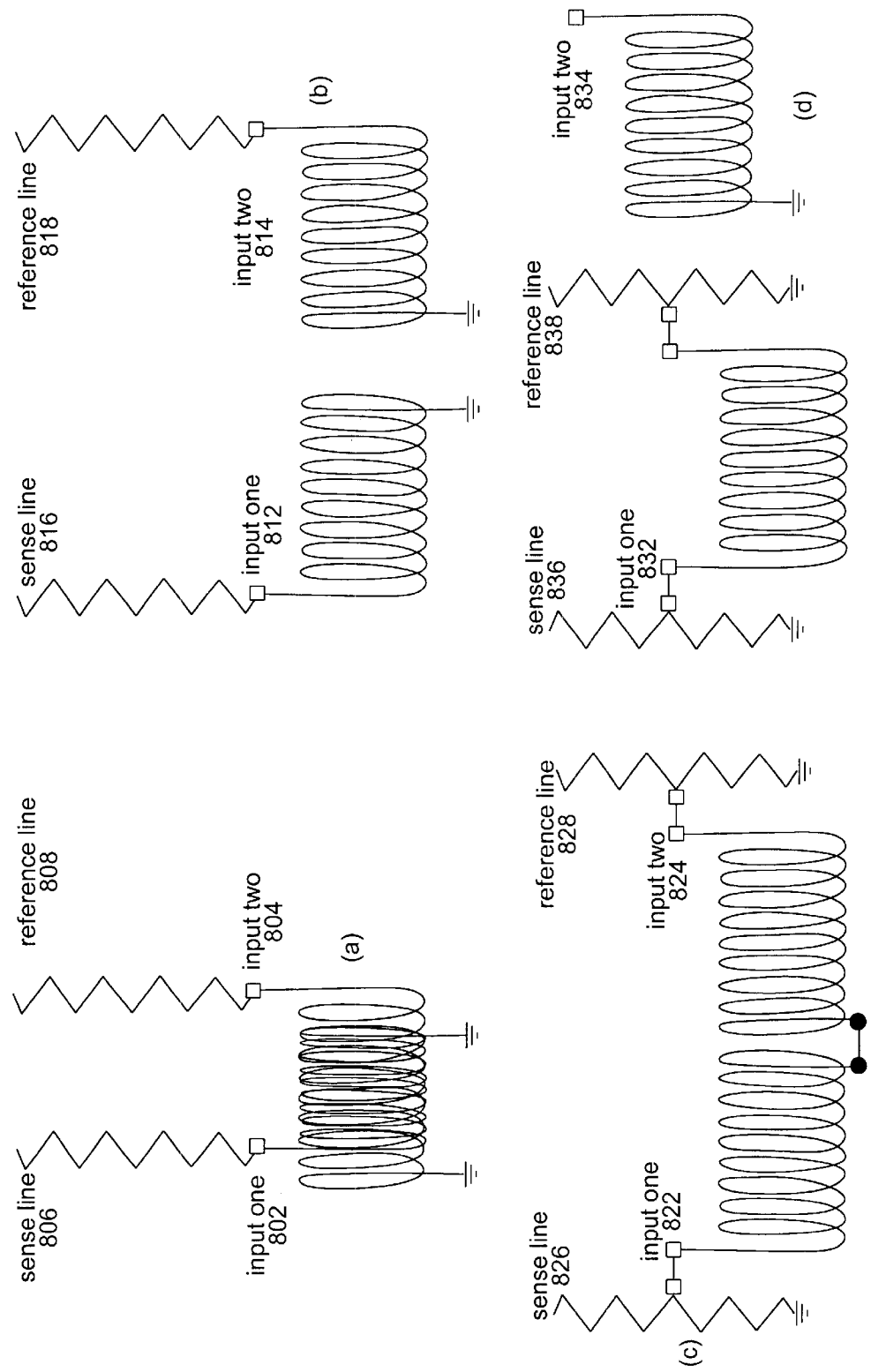
FIGS. 8a–8d illustrate four different embodiments in which a transpinnor is used to balance a sense-digit/reference line pair.

The four configurations of FIG. 8 lead to four different methods of using transpinnors for resistive trimming.

A differential transpinnor exhibits hysteresis unless operated in a specific way. This hysteresis can be avoided if the transpinnor is biased in the hard direction of the low coercivity (e.g., permalloy) layer with a field greater than or equal to the anisotropy field. This eliminates the hysteresis and the permeability becomes very large. The high coercivity (e.g., cobalt) layer is largely unaffected because its anisotropy field is typically much larger than that of the low coercivity layer. The signal field is applied by the input lines of the transpinnor and is in the easy-axis direction.

A second method which requires no bias field is to fabricate the transpinnor with the easy axis of the low coercivity layer perpendicular to the easy axis of the high coercivity layer. The low coercivity layer thus undergoes uniform magnetization rotation rather than wall-motion switching.

A third method of dealing with transpinnor hysteresis is to initialize the transpinnor the same way before each read operation. For example, each read operation could be started by the application of a negative pulse which switches all the low coercivity layers but not any of the high coercivity layers. This erases any previous low coercivity layer history.

According to a fourth method, the low coercivity layer of the transpinnor is initialized antiparallel to the high coercivity layer, leaving it on the very steep part of the hysteresis curve (see FIG. 2). A small input current will then produce a large output.

According to a specific embodiment of the invention, when a transpinnor is used to balance a sense-digit line against its reference line, the resistive elements of the transpinnor are adjusted such that when the sense-digit and reference lines are in identical magnetic states (i.e., with the same number of ones and zeros in the storage layers of the two lines and at the corresponding locations in each, and with the same corresponding magnetizations in the readout layers of the two lines), the transpinnor gives zero output. When the magnetization of the readout layer a bit is changed on the reference line but not the sense-digit line, the ratio of resistances changes and the transpinnor gives a nonzero output. That is, the transpinnor is adjusted to give zero output not when both input currents are equal, but when the sense-digit line and the reference line are in the same magnetic state. Note that the voltages applied to the two lines are equal, but because the resistances are unequal, the currents in the lines are unequal.

During a read operation, the read current through the trimming transpinnor is large enough to switch its low coercivity layer, but not its high coercivity layer. Therefore, the trimming adjustment is made to the high coercivity layer (which remains in the partially switched state during the read operation), not the low coercivity layer (which needs to be free to change in response to the read current). The high coercivity layer in the transpinnor is not affected by write operations because the resistive elements of the transpinnors are not physically connected to the sense-digit lines.

It will be understood that by properly balancing a transpinnor coupled to a sense-digit/reference line pair, the additional steps otherwise required for removing the read operation pedestal may be eliminated and the read time correspondingly reduced.

While the invention has been particularly shown and described with reference to specific embodiments thereof, it will be understood by those skilled in the art that changes in the form and details of the disclosed embodiments may be made without departing from the spirit or scope of the invention. For example, specific embodiments of the invention have been described herein with reference to the balancing of sense/reference line pairs in random access memory arrays. However, it will be understood that the techniques of the present invention relate more generally to a wide variety of resistive trimming applications including, for example, the setting of individual resistive elements to specified values, or the setting of a quiescent operation point for a transpinnor in any of a variety of applications.

In addition, although the descriptions of specific embodiments herein appear to be referring to the switching of one particular layer in a GMR structure, it will be understood that such embodiments may in fact encompass the switching of multiple layers. That is, for example, when the specification refers to the switching of a high coercivity layer in a GMR structure, it may in fact be referring collectively to the switching of a plurality of such layers in a GMR structure having multiple periods of high and low coercivity films.

It should also be understood that the elements of the basic transpinnor of the present invention may be configured and fabricated in a variety of ways to achieve the trimming techniques described herein. For example, the idealized transpinnor depicted in FIG. 5 may be fabricated as described above with reference to FIG. 6. However, there are a number of alternative configurations which are suitable for the described and other embodiments.

Figure 9:
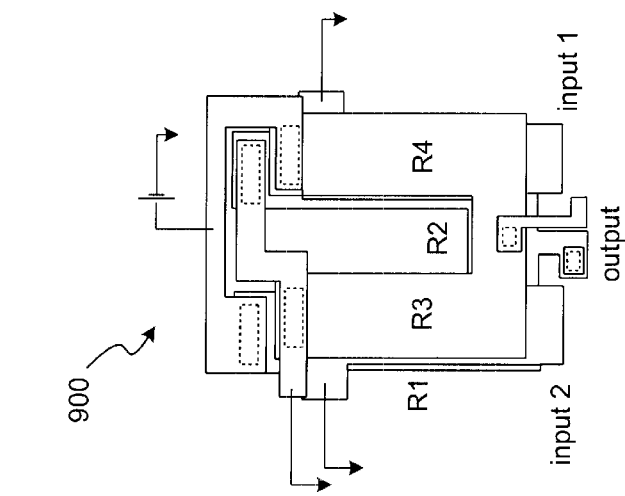
FIG. 9 is a simplified representation of a differential transpinnor in integrated circuit form.

For example, the transpinnor of FIG. 5 may also be fabricated as shown in FIG. 9 which depicts a differential transpinnor 900 in IC form. As described above with reference to FIG. 5, $R_1$–$R_4$ comprise GMR films, and inputs 1 and 2 comprise electrical conductors, e.g., copper, for applying magnetic fields to the GMR films. The broken lines indicate connections to the layer underneath. For the sake of clarity, insulating layers are not shown.

Figure 10:
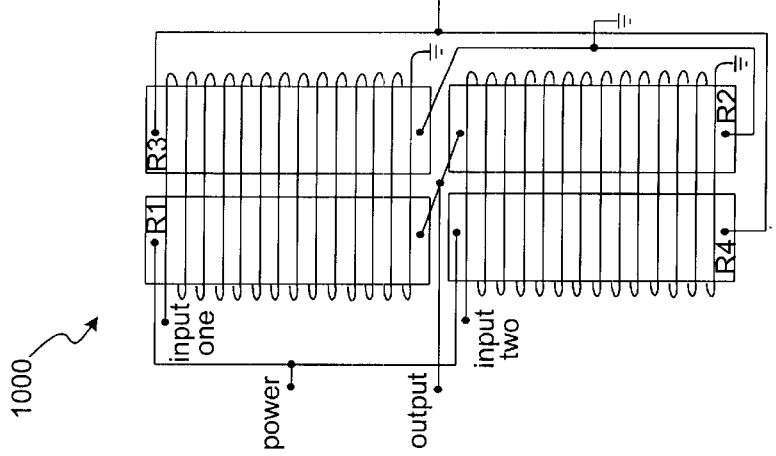
FIG. 10 is a simplified representation of a hybrid transpinnor.

In addition, a hybrid form of transpinnor 500 (i.e., transpinnor 1000 of FIG. 10) can made by etching a GMR film into four equal parts ($R_1$–$R_4$), making the necessary electrical connections, and winding two external input coils (inputs 1 and 2) around the resistive elements as shown. This hybrid design has the advantage that only one GMR film is used so that the behavior of all four legs of the transpinnor is the same. In addition, the wound input lines are easy to construct. In general, transpinnor 1000 is relatively simple to manufacture and may be particularly useful in applications which do not require IC fabrication.

Figure 11:
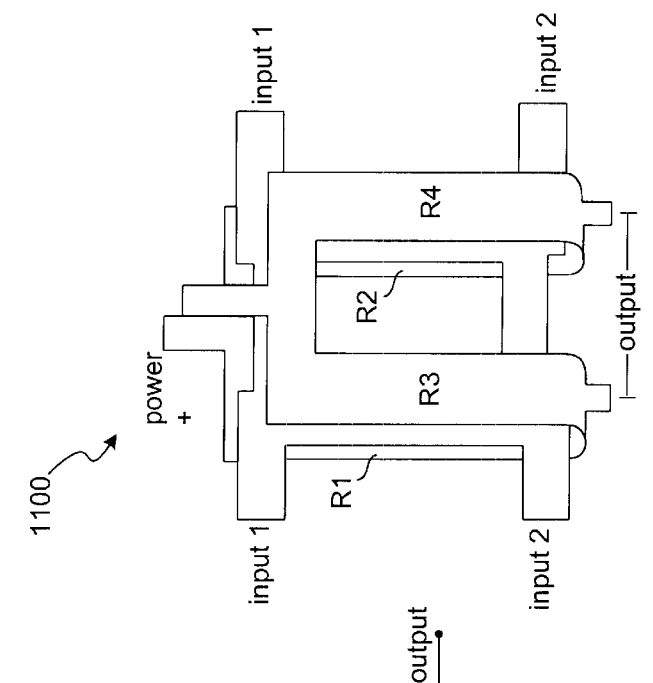
FIG. 11 is a simplified representation of a differential transpinnor having two layers of input lines.

As an alternative to transpinnors 500, 900, and 1000, each input line may be configured to affect the magnetizations of all four of the resistive elements. In an embodiment fabricated similarly to transpinnor 1000, each of the input lines is wound around all four of the resistive elements. In an IC embodiment, two layers of input lines are employed. Such an embodiment is exemplified by transpinnor 1100 of FIG. 11. Input lines 1 and 2 are configured in such a way that they tend to neutralize each other. That is, the field experienced by each of the four resistive elements $R_1$–$R_4$ corresponds to the difference between the currents in the two input conductors. Although this design is slightly more complex than the designs of FIGS. 9 and 10, it has the advantage of greater sensitivity.

In view of the wide variety of ways in which the principles of the present invention may be given effect, the scope of the invention should be determined with reference to the appended claims.

What is claimed is:

1. An electronic device comprising at least one configurable resistive element having a resistance value associated therewith, each configurable resistive element comprising at least one multi-layer thin film element exhibiting giant magnetoresistance, the resistance value of each configurable resistive element being configurable over a resistance value range by application of at least one magnetic field which manipulates at least one magnetization vector associated with the at least one thin film element.

2. The electronic device of claim 1 wherein each multi-layer thin film element of each configurable resistive element comprises at least one high coercivity layer and at least one low coercivity layer, the resistance value associated with each multi-layer thin film element being configurable by at least partially switching a first magnetization vector associated with the at least one high coercivity layer.

3. The electronic device of claim 1 wherein each configurable resistive element comprises a network of thin-film elements in a bridge configuration, at least one thin-film element exhibiting giant magnetoresistance, and at least one conductor inductively coupled to the at least one thin-film element for applying the at least one magnetic field thereto.

4. The electronic device of claim 3 wherein the network of thin-film elements is configured to operate as a logic gate having an amplification factor associated therewith, and wherein application of the at least one magnetic field results in alteration of the amplification factor.

5. The electronic device of claim 4 wherein each multi-layer thin film element of each configurable resistive element comprises at least one high coercivity layer and at least one low coercivity layer, the resistance value associated with each multi-layer thin film element being configurable by at least partially switching a first magnetization vector associated with the at least one high coercivity layer.

6. The electronic device of claim 4 wherein the electronic device comprises a memory comprising a plurality of memory cells and a plurality of access lines for facilitating access to the memory cells, selected access lines having an output of at least one of the configurable resistive elements directly connected thereto.

7. The electronic device of claim 3 wherein the network of thin-film elements is configured to operate as a differential amplifier having an amplification factor associated with each of two inputs, and wherein application of the at least one magnetic field results in alteration of the amplification factor associated with at least one of the two inputs.

8. The electronic device of claim 7 wherein each multi-layer thin film element of each configurable resistive element comprises at least one high coercivity layer and at least one low coercivity layer, the resistance value associated with each multi-layer thin film element being configurable by at least partially switching a first magnetization vector associated with the at least one high coercivity layer.

9. The electronic device of claim 7 wherein the electronic device comprises a memory comprising a plurality of memory cells and a plurality of sense and reference lines, selected sense and reference lines having the at least one conductor of at least one of the configurable resistive elements directly connected thereto.

10. The electronic device of claim 3 further comprising at least one component having a two-channel output corresponding to first and second output nodes, the network of thin-film elements being coupled between the first and second output nodes and configurable using the at least one conductor to balance the first and second output nodes and amplify the two-channel output.

11. The electronic device of claim 1 wherein each configurable resistive element comprises a single multi-layer thin film element.

12. The electronic device of claim 11 wherein the single multi-layer thin film element comprises at least one high coercivity layer and at least one low coercivity layer, the resistance value associated with the single multi-layer thin film element being configurable by at least partially switching a first magnetization vector associated with the at least one high coercivity layer.

13. The electronic device of claim 1 wherein the at least one multi-layer thin film element comprises a plurality of periods of low and high coercivity layers.

14. The electronic device of claim 1 wherein the at least one multi-layer thin film element comprises a single period of low and high coercivity layers.

15. A method for configuring a configurable resistive element in an electronic device, the configurable resistive element having a resistance value associated therewith and comprising at least one multi-layer thin film element exhibiting giant magnetoresistance, the method comprising applying at least one magnetic field to the configurable resistive element which manipulates at least one magnetization vector associated with the at least one thin film element thereby configuring the resistance value.

16. The method of claim 15 wherein each thin film element of each configurable resistive element comprises at least one high coercivity layer and at least one low coercivity layer, and wherein applying the at least one magnetic field comprises partially switching a first magnetization vector associated with the at least one high coercivity layer.

17. The method of claim 15 wherein each configurable resistive element comprises a network of thin-film elements in a bridge configuration, at least one thin-film element exhibiting giant magnetoresistance, and at least one conductor inductively coupled to the at least one thin-film element for applying the at least one magnetic field thereto, the method further comprising configuring the network of thin-film elements to operate as a logic gate having an amplification factor associated therewith, and wherein applying the at least one magnetic field comprises altering the amplification factor.

18. The method of claim 15 wherein each configurable resistive element comprises a network of thin-film elements in a bridge configuration, at least one thin-film element exhibiting giant magnetoresistance, and at least one conductor inductively coupled to the at least one thin-film element for applying the at least one magnetic field thereto, the method further comprising configuring the network of thin-film elements to operate as a differential amplifier having an amplification factor associated with each of two inputs, and wherein applying the at least one magnetic field comprises altering the amplification factor associated with at least one of the two inputs.

19. The method of claim 15 wherein each configurable resistive element comprises a network of thin-film elements in a bridge configuration, at least one thin-film element exhibiting giant magnetoresistance, and at least one conductor inductively coupled to the at least one thin-film element for applying the at least one magnetic field thereto, the electronic device further comprising at least one component having a two-channel output corresponding to first and second output nodes, the network of thin-film elements being coupled between the first and second output nodes, and wherein applying the at least one magnetic field comprises balancing the first and second output nodes and amplifying the two-channel output.

* * * * *